(12) United States Patent  
Joe et al.

(10) Patent No.: US 9,097,773 B2
(45) Date of Patent: Aug. 4, 2015

(54) APPARATUS AND METHOD FOR ESTIMATING PARAMETER OF SECONDARY BATTERY

(71) Applicant: LG CHEM, LTD., Seoul (KR)

(72) Inventors: Won-Tae Joe, Daejeon (KR);
Geun-Chang Chung, Daejeon (KR);
Sun-Young Cha, Seoul (KR)

(73) Assignee: LG Chem, Ltd., Seoul (KR)

( * ) Notice: Subject to any disclaimer, the term of this patent is extended or adjusted under 35 U.S.C. 154(b) by 0 days.

(21) Appl. No.: 14/527,505

(22) Filed: Oct. 29, 2014

(65) Prior Publication Data

US 2015/0066407 A1  Mar. 5, 2015

Related U.S. Application Data

(63) Continuation of application No. PCT/KR2013/002145, filed on Mar. 15, 2013.

(30) Foreign Application Priority Data

Apr. 30, 2012 (KR) .................. 10-2012-0045868
Mar. 15, 2013 (KR) .................. 10-2013-0028284

(51) Int. Cl.
*G01R 31/36* (2006.01)
*H01M 10/48* (2006.01)

(52) U.S. Cl.
CPC ........ *G01R 31/3648* (2013.01); *G01R 31/3606* (2013.01); *G01R 31/3679* (2013.01); *H01M 10/48* (2013.01); *H01M 10/486* (2013.01); *G01R 31/362* (2013.01)

(58) Field of Classification Search
CPC ................................................. G01R 31/3648
USPC .......................................................... 702/63
See application file for complete search history.

(56) References Cited

U.S. PATENT DOCUMENTS

| | | | |
|---|---|---|---|
| 6,677,082 B2 | 1/2004 | Thackeray et al. | |
| 6,680,143 B2 | 1/2004 | Thackeray et al. | |
| 8,810,203 B2* | 8/2014 | Abe et al. .................... | 320/132 |
| 2004/0158296 A1* | 8/2004 | Greatbatch et al. ............ | 607/34 |

(Continued)

FOREIGN PATENT DOCUMENTS

| | | |
|---|---|---|
| JP | 2000-243459 A | 9/2000 |
| JP | 2003-107139 A | 4/2003 |

(Continued)

OTHER PUBLICATIONS

International Search Report issued in PCT/KR2013/002145, mailed on Jul. 5, 2013.
Written Opinion issued in PCT/KR2013/002145, mailed on Jul. 5, 2013.

*Primary Examiner* — Bryan Bui
(74) *Attorney, Agent, or Firm* — Birch, Stewart, Kolasch & Birch, LLP

(57) ABSTRACT

Disclosed is an apparatus and method for estimating a parameter of a secondary battery. The apparatus includes a sensor configured to measure an open circuit voltage ($OCV_m$) of the secondary battery at a first depth of discharge (DOD'), the open circuit voltage ($OCV_m$) corresponding to a difference between a predetermined original cathode voltage ($V_{c,o}$) at the first depth of discharge (DOD') and an anode voltage ($V_a$), and a control unit configured to calculate an anode voltage ($V_a$) from the original cathode voltage ($V_{c,o}$) and the open circuit voltage ($OCV_m$), determining that the original anode voltage ($V_{a,o}$) is identical to the anode voltage ($V_a$), determining a second depth of discharge (DOD'') corresponding to the original anode voltage ($V_{a,o}$), and determining capacity degradation ($\Delta capa$) of the secondary battery according to a difference between the first depth of discharge (DOD') and the second depth of discharge (DOD'').

23 Claims, 7 Drawing Sheets

(56) References Cited

U.S. PATENT DOCUMENTS

| | | |
|---|---|---|
| 2005/0017687 A1 | 1/2005 | Nagaoka |
| 2007/0145953 A1* | 6/2007 | Asai et al. .................... 320/149 |
| 2010/0036626 A1 | 2/2010 | Kang et al. |
| 2010/0256935 A1 | 10/2010 | Imanishi et al. |

FOREIGN PATENT DOCUMENTS

| | | |
|---|---|---|
| JP | 2005-037151 A | 2/2005 |
| JP | 2009-128250 A | 6/2009 |
| KR | 2003-0013215 A | 2/2003 |
| KR | 10-2010-0019249 A | 2/2010 |

* cited by examiner (a)  (b)  (c) 45.23%

APPARATUS AND METHOD FOR ESTIMATING PARAMETER OF SECONDARY BATTERY

CROSS-REFERENCE TO RELATED APPLICATION

The present application is a continuation of International Application No. PCT/KR2013/002145 filed on Mar. 15, 2013, which claims priority under 35 USC 119(a) to Korean Patent Application No. 10-2012-0045868 filed on Apr. 30, 2012 and Korean Patent Application No. 10-2013-0028284 filed on Mar. 15, 2013 in the Republic of Korea, the disclosures of which are incorporated herein by reference.

TECHNICAL FIELD

The present disclosure relates to a secondary battery, and more particularly, to an apparatus and method for estimating a parameter which represents an electrical state of a secondary battery.

BACKGROUND ART

A battery generates electric energy by oxidation and reduction reactions and is widely used in various ways. For example, a battery is applied to portable devices such as cellular phones, laptops, digital cameras, video cameras, tablet computers, and electric tools; electric-driven apparatuses such as electric bikes, motor cycles, electric vehicles, hybrid vehicles, electric ships, and electric airplanes; power storage devices used for storing power generated by new regeneration energy or surplus energy; uninterruptible power supplies for stably supplying power to various information communication devices such as server computers and base stations for communication, and so on.

A battery includes three basic components: an anode containing material which is oxidized while emitting electrons during discharge, a cathode containing material which is reduced while accepting electrons during discharge, and an electrolyte allowing the transfer of operating ions between the anode and the cathode. Batteries may be classified into primary batteries which are not reusable after discharge, and secondary batteries which allow repeated charge and discharge since their electrochemical reaction is at least partially reversible.

The secondary batteries include lead-acid batteries, nickel-cadmium batteries, nickel-zinc batteries, nickel-iron batteries, silver oxide batteries, nickel metal hydride batteries, zinc-manganese oxide batteries, zinc-bromide batteries, metal-air batteries, lithium secondary batteries and so on, as well known in the art. Among them, lithium secondary batteries are drawing the most attention due to their high energy density, high battery voltage and long life cycle in comparison to other secondary batteries.

Meanwhile, a depth of discharge (DoD) of a secondary battery relatively shows a discharged capacity of the secondary battery in a range of 0 to 1 based on an original capacity of the secondary battery.

Here, the original capacity means a value obtained by integrating an amount of current flowing out of a secondary battery in a state of Beginning Of Life (BOL) while discharging from a maximum charging voltage to a final discharge voltage.

For example, if a secondary battery has an original capacity of 1000 mAh and an integrated value of discharge current discharging from the secondary battery after the secondary battery is fully charged is 700 mAh, the depth of discharge (DoD) will be calculated to be 0.7.

Chemical substances (for example, lithium ions) participating in electrochemical reactions of a secondary battery irreversibly disappear as charging and discharging cycles increase. The lost chemical substances cause a capacity degradation of the secondary battery, and if the secondary battery suffers from capacity degradation, the voltage of the secondary battery reaches a final discharge voltage before the depth of discharge (DoD) reaches 1. Therefore, the depth of discharge (DoD) when reaching the final discharge voltage decreases in proportion to the capacity degradation.

For example, if the secondary battery has a final discharge voltage of 3.0V and the capacity degradation of the secondary battery has progressed by 20%, when the depth of discharge (DoD) of the secondary battery increases to 0.80, the voltage of the secondary battery decreases to 3.0V which is a final discharge voltage.

The capacity degradation of the secondary battery is a parameter required for accurately calculating a state of charge (SOC) of the secondary battery. The SOC is a parameter relatively representing a presently remaining capacity of a secondary battery in the range of 0 to 1 based on the entire capacity of the secondary battery on which capacity degradation is reflected.

The SOC of the secondary battery may be calculated by using a depth of discharge (DoD) of the secondary battery as in Equation 1 below.

$$SOC = (DoD_{max} - DoD)/DoD_{max}$$

$$DoD_{max} = 1 - \Delta Capa \quad \text{Equation 1}$$

Here, SOC is a parameter representing present state of charge of the secondary battery, $DoD_{max}$ is a parameter representing a depth of discharge (DoD) when the secondary battery reaches a final discharge voltage, DoD is a parameter representing a present depth of discharge (DoD), and $\Delta Capa$ is a parameter representing capacity degradation of the secondary battery in the range of 0 to 1.

In Equation 1, since DoD is a measurable parameter, the SOC of the secondary battery is resultantly determined according to capacity degradation of the secondary battery, expressed by $\Delta Capa$.

The capacity degradation of the secondary battery may be accurately calculated by integrating an amount of current drawn from the secondary battery while the secondary battery charged to a maximum charging voltage is fully discharged to a final discharge voltage, and then comparing the integrated current amount with the original capacity.

However, in a circumstance where the secondary battery is actually used, a full discharge event rarely occurs at which the capacity degradation of the secondary battery can be accurately calculated. Therefore, in the related art, a method for indirectly estimating capacity degradation of a secondary battery is used.

For example, since an internal resistance of a secondary battery has a relation with capacity degradation, the internal resistance of the secondary battery may be estimated by sampling voltage and current of the secondary battery, and the capacity degradation of the secondary battery may be estimated according to the estimated internal resistance.

However, the capacity degradation of the secondary battery may not be exactly measured in this way, and furthermore the accuracy in estimation of the capacity degradation deteriorates according to a temperature change of a secondary battery.

DISCLOSURE

Technical Problem

The present disclosure is directed to providing an apparatus and method for estimating a parameter of a secondary battery, which allows simple and accurate estimation of capacity degradation of a secondary battery in an environment where the secondary battery is actually used.

The present disclosure is also directed to providing an apparatus and method for estimating a parameter of a secondary battery, which allows estimation of an open circuit voltage, a depth of discharge (DoD) or a state of charge (SOC) of a secondary battery by using the estimated capacity degradation.

Technical Solution

In one aspect of the present disclosure, there is provided an apparatus for estimating a parameter of a secondary battery, which includes a sensor configured to measure an open circuit voltage ($OCV_m$) of the secondary battery at a first depth of discharge (DOD'), the open circuit voltage ($OCV_m$) corresponding to a difference between a predetermined cathode voltage ($V_{c,o}$) at the first depth of discharge (DOD') and an anode voltage ($V_a$); and a control unit configured to calculate an anode voltage ($V_a$) from the original cathode voltage ($V_{c,o}$) and the open circuit voltage ($OCV_m$), determining that the original anode voltage ($V_{a,o}$) is identical to the anode voltage ($V_a$), determining a second depth of discharge (DOD") corresponding to the original anode voltage ($V_{a,o}$), and determining capacity degradation ($\Delta capa$) of the secondary battery according to a difference between the first depth of discharge (DOD') and the second depth of discharge (DOD").

In the present disclosure, the original cathode voltage ($V_{c,o}$) and the original anode voltage ($V_{a,o}$) are respectively experimentally measured values measured in advance as a cathode voltage and an anode voltage according to the depth of discharge (DoD) when the secondary battery has substantially no capacity degradation.

The original cathode voltage ($V_{c,o}$) and the original anode voltage ($V_{a,o}$) may be measured based on a reference voltage at which potential may be 0 (for example, a lithium electrode).

The secondary battery may have substantially no capacity degradation just after the secondary battery is fabricated, for example when a charging/discharging cycle of the secondary battery is not yet initiated (Beginning Of Life: BOL).

Preferably, the apparatus for estimating a parameter of a secondary battery according to the present disclosure may further include a storage unit in which the original cathode voltage ($V_{c,0}$) and the original anode voltage ($V_{a,o}$) measured for each depth of discharge (DoD) are stored as profile data.

Hereinafter, the original cathode voltage ($V_{c,0}$) and the original anode voltage ($V_{a,o}$) measured for each depth of discharge (DoD) will be respectively called as an original cathode voltage profile and an original anode voltage profile.

The anode voltage ($V_a$) means a present voltage formed at an anode of the secondary battery and may be calculated from a difference between the original cathode voltage ($V_{c,o}$) and the open circuit voltage ($OCV_m$).

The first depth of discharge (DoD') corresponds to a relative ratio of an integrated current amount of the secondary battery calculated by ampere counting to an original capacity of the secondary battery.

Preferably, the sensor may measure a current while the secondary battery is being charged or discharged, and provide the measured current to the control unit. Also, the control unit may calculate the first depth of discharge (DoD') by integrating the measured discharge currents. The storage unit may store the original capacity of the secondary battery, and the control unit may refer to the original capacity of the secondary battery stored in the storage unit when calculating the first depth of discharge (DoD'). The level of the first depth of discharge (DoD') serving as a reference for measuring the open circuit voltage ($OCV_m$) may be preset as a fixed value or vary as desired.

In another aspect, the control unit may shift an original anode voltage profile of the secondary battery as much as the determined capacity degradation, obtain a degraded open circuit voltage profile of the secondary battery from the original cathode voltage profile and the shifted original anode voltage profile, and optionally store the degraded open circuit voltage profile in the storage unit.

In another aspect, the control unit may measure an open circuit voltage of the secondary battery, determine a depth of discharge (DoD) of the secondary battery from the degraded open circuit voltage profile by using the measured open circuit voltage, and optionally estimate SOC of the secondary battery by using the determined depth of discharge (DoD) and the determined capacity degradation ($\Delta capa$).

In the present disclosure, the control unit may store, transmit or display at least one parameter selected from the group consisting of the determined capacity degradation, the determined open circuit voltage, the determined depth of discharge (DoD) and the determined SOC.

In another aspect of the present disclosure, there is also provided a method for estimating a parameter of a secondary battery, which includes measuring an open circuit voltage ($OCV_m$) of the secondary battery at a first depth of discharge (DOD'), the open circuit voltage ($OCV_m$) corresponding to a difference between an original cathode voltage ($V_{c,o}$) predetermined at the first depth of discharge (DOD') and an anode voltage ($V_a$); calculating an anode voltage ($V_a$) from the original cathode voltage ($V_{c,o}$) and the open circuit voltage ($OCV_m$) and determining that the original anode voltage ($V_{a,o}$) is identical to the anode voltage ($V_a$); obtaining a second depth of discharge (DOD") corresponding to the original anode voltage ($V_{a,o}$); and determining capacity degradation ($\Delta capa$) of the secondary battery according to a difference between the first depth of discharge (DOD') and the second depth of discharge (DOD").

Selectively, the method for estimating a parameter of a secondary battery may further include shifting an original anode voltage profile of the secondary battery as much as the determined capacity degradation, and obtaining a degraded open circuit voltage profile of the secondary battery from the original cathode voltage and the shifted original anode voltage.

Selectively, the method for estimating a parameter of a secondary battery may further include measuring an open circuit voltage of the secondary battery, determining a depth of discharge of the secondary battery from the degraded open circuit voltage profile by using the measured open circuit voltage, and optionally estimating SOC of the secondary battery by using the determined depth of discharge and the determined capacity degradation.

Selectively, the method for estimating a parameter of a secondary battery may further include measuring a depth of discharge (DoD) of the secondary battery, and determining an open circuit voltage of the secondary battery from the degraded open circuit voltage profile by using the measured depth of discharge (DoD).

Selectively, the method for estimating a parameter of a secondary battery may further include storing, displaying or transmitting the determined at least one parameter selected from the group consisting of the determined capacity degradation, the determined open circuit voltage, the determined depth of discharge (DoD), and the determined SOC.

In the present disclosure, the secondary battery may include a blended cathode material which has a first cathode material and a second cathode material with different operating voltage ranges.

Preferably, at least one of the first cathode material and the second cathode material may have a voltage profile with a voltage plateau.

The first and second cathode materials have different concentrations of operating ions reacting therewith according to the change of voltage and allow voltage relaxation by transferring the operating ions between the first and second cathode materials when coming to an idle state or a no-load state in an intrinsic voltage range. The secondary battery may be charged or discharged in a voltage range including the intrinsic voltage range.

Here, the operating ions mean ions performing an electrochemical reaction with the first and second cathode materials when a secondary battery having the blended cathode material is being charged or discharged. The operating ions may vary depending on the kind of the secondary battery. For example, the operating ions may be lithium ions in the case of a lithium secondary battery.

The electrochemical reaction may vary according to an operating mechanism of the secondary battery. In an embodiment, the electrochemical reaction may mean that operating ions are intercalated into or deintercalated from the first cathode material and/or the second cathode material. In this case, the concentration of operating ions intercalated into the first and second cathode materials or the concentration of operating ions deintercalated from the first and second cathode materials may vary according to the change of voltage of the secondary battery. In other words, the first and second cathode materials have different operating voltage ranges as to the operating ions. For example, under the condition where the secondary battery is discharged, at a certain voltage range, operating ions may be preferentially intercalated into the first cathode material rather than the second cathode material, and at another voltage range, it may be the opposite. As another example, under the condition where the secondary battery is charged, at a certain voltage range, operating ions may be preferentially deintercalated from the second cathode material rather than the first cathode material, and at another voltage range, it may be the opposite.

The above idle state means a state in which a high discharge current is drawn from a secondary battery toward a main load of equipment on which the secondary battery is loaded is interrupted, and a minimal discharge current required for an electronic device included in the equipment is drawn from the secondary battery. If the secondary battery comes to an idle state, the discharge current drawn from the secondary battery is very low. When the secondary battery comes to an idle state, the magnitude of the current drawn from the secondary battery may be constant, substantially constant or variable.

For example, the idle state may refer to cases in which (i) a small discharge current is supplied to a computer unit or an audio instrument loaded in an electric vehicle, even though the secondary battery does not supply a discharge current to a motor just after a driver starts the electric vehicle, when a secondary battery is loaded in the electric vehicle; (ii) a driver driving an electric vehicle momentarily stops the electric vehicle at a traffic signal or parks the electric vehicle at a parking lot; (iii) a processor of the information communication device shifts to a sleep mode in order to save energy when an information communication device on which a secondary battery is loaded does not operate for a predetermined time without turning off.

The no-load state means a state in which the capacity of the secondary battery does not substantially change since the secondary battery stops charging or discharging.

The voltage relaxation means a phenomenon in which a potential difference is generated between the first and second cathode materials when the secondary battery comes to an idle state or a no-load state, where the potential differences cause the transfer of operating ions between the cathode materials so that the potential difference decreases as time passes.

Here, the voltage relaxation occurs when the secondary battery including the blended cathode material and being discharged in the intrinsic voltage range shifts to an idle state or a no-load state. If the secondary battery is discharged in the intrinsic voltage range, among the first and second cathode materials, the reaction capacity of the cathode material that more preferentially reacts with operating ions become almost exhausted, and so the other cathode material starts to react with the operating ions.

Under this condition, if the secondary battery shifts to an idle state or a no-load state, operating ions present near the surfaces of the first cathode material and the second cathode material are diffused toward the center of the corresponding cathode material at different diffusion speeds, thereby generating a potential difference between the cathode materials. The generated potential difference causes the transfer of operating ions between the cathode materials and as a result brings a voltage relaxation which eliminates the potential difference of the cathode materials.

Considering the phenomenon of the voltage relaxation, the idle state or the no-load state may also be defined by the following viewpoint. In other words, if a discharge current is drawn from a secondary battery, operating ions are intercalated into the cathode materials. However, if the magnitude of the discharge current is sufficiently small, even though operating ions are intercalated into the cathode materials, the transfer of the operating ions between the cathode materials for the voltage relaxation may maintain. Therefore, a state in which the flow of a small discharge current does not disturb the occurrence of a voltage relaxation between cathode materials and a state in which a discharge current does not flow may be defined as an idle state or a no-load state, respectively.

The intrinsic voltage range may vary according to various factors such as the kind of first and second cathode materials, the magnitude of charge or discharge current of the secondary battery, a SOC of the secondary battery when the secondary battery comes to an idle state or a no-load state, or the like.

In the present disclosure, the voltage relaxation phenomenon exhibited by the first and second cathode materials in the intrinsic voltage range may occur between the cathode materials satisfying at least one of the following conditions.

For example, the voltage relaxation may occur if, when dQ/dV distribution of the first and second cathode materials is measured, locations and/or intensities of main peaks exhibited in the dQ/dV distribution of the cathode materials are different from each other. Here, the dQ/dV distribution, as well known in the art, means capacity characteristics of the cathode material in accordance with voltages. Therefore, cathode materials whose main peaks exhibited in the dQ/dV distribution have different locations and/or different intensities may be regarded as having different operating voltage ranges. The difference in locations of the main peaks may vary according to the kind of the first and second cathode materials, and for example the locations of the main peaks may be different from each other by 0.1 to 4V.

As another example, the voltage relaxation may occur if, when a discharge resistance is measured at SOCs of 0-100% with respect to the secondary battery including the blended cathode material, a discharge resistance profile has a convex pattern (so-called a protruding shape).

As another example, the voltage relaxation may occur if, when discharge resistance of each SOC is measured with respect to the secondary battery including the blended cathode material, a discharge resistance profile has at least two inflection points before and after the convex pattern.

As another example, the voltage relaxation may occur if the secondary battery including the blended cathode material has a charge or discharge profile with at least one voltage plateau. Here, the voltage plateau means a voltage range where an inflection point is present and a voltage change is small before and after the inflection point.

As another example, the voltage relaxation may occur if at least one of the first and second cathode materials included in the blended cathode material has a voltage profile with a voltage plateau.

In the present disclosure, materials useable as the first and second cathode materials are not specially limited if they may cause voltage relaxation in the intrinsic voltage range.

In an embodiment, the first cathode material may be an alkali metal compound expressed by a general chemical formula $A[A_xM_y]O_{2+z}$ wherein A includes at least one of Li, Na and K; M includes at least one element selected from the group consisting of Ni, Co, Mn, Ca, Mg, Al, Ti, Si, Fe, Mo, V, Zr, Zn, Cu, Mo, Sc, Zr, Ru and Cr; $x \geq 0$, $1 \leq x+y \leq 2$, $-0.1 \leq z \leq 2$; and x, y, z and stoichiometric coefficients of the components included in M are selected so that the alkali metal compound maintains electrical neutrality.

Alternatively, the first cathode material may be an alkali metal compound expressed by $xLiM^1O_2$-$(1-x)Li_2M^2O_3$ wherein $M^1$ includes at least one element with an average oxidation state of +3; $M^2$ includes at least one element with an average oxidation state of +4; and $0 \leq x \leq 1$, which is disclosed in U.S. Pat. No. 6,677,082, U.S. Pat. No. 6,680,143 or the like.

In another embodiment, the second cathode material may be lithium metal phosphate expressed by a general chemical formula $Li_aM^1{}_xFe_{1-x}M^2{}_yP_{1-y}M^3{}_zO_{4-z}$, wherein $M^1$ includes at least one element selected from the group consisting of Ti, Si, Mn, Co, Fe, V, Cr, Mo, Ni, Nd, Mg and Al; $M^2$ includes at least one element selected from the group consisting of Ti, Si, Mn, Co, Fe, V, Cr, Mo, Ni, Nd, Mg and Al As, Sb, Si, Ge, V and S; $M^3$ includes at least one element selected from a halogen group containing F; $0 < a \leq 2$, $0 \leq x \leq 1$, $0 \leq y < 1$, $0 \leq z < 1$; and a, x, y, z, and stoichiometric coefficients of the components included in $M^1$, $M^2$, and $M^3$ are selected so that the lithium metal phosphate maintains electrical neutrality, or $Li_3M_2(PO_4)_3$, wherein M includes at least one element selected from the group consisting of Ti, Si, Mn, Fe, Co, V, Cr, Mo, Ni, Mg and Al.

In another embodiment, the first cathode material may be an alkali metal compound expressed by $Li[Li_aNi_bCo_cMn_d]O_{2+z}$ ($a \geq 0$; $a+b+c+d=1$; at least one of b, c and d is not zero; $-0.1 \leq z \leq 2$). In addition, the second cathode material may be at least one selected from the group consisting of $LiFePO_4$, $LiMn_xFe_yPO_4$ ($0 < x+y \leq 1$) and $Li_3Fe_2(PO_4)_3$.

In another embodiment, the first cathode material and/or the second cathode material may include a coating layer. The coating layer may include a carbon layer, or an oxide layer or a fluoride layer containing at least one element selected from the group consisting of Ti, Si, Mn, Co, Fe, V, Cr, Mo, Ni, Nd, Mg, Al, As, Sb, Si, Ge, V and S.

In the present disclosure, a blending ratio of the first and second cathode materials may be suitably adjusted according to an electrochemical design condition considering the usage of a secondary battery to be manufactured, an electrochemical characteristic of cathode materials required for causing a voltage relaxation between the cathode materials, an intrinsic voltage range where voltage relaxation occurs, or the like.

In addition, the number of cathode materials capable of being included in the blended cathode material is not limited to two. In addition, in order to improve properties of the blended cathode material, other additives such as a conducting agent and a binder may be added to the blended cathode material without special restriction. Therefore, a blended cathode material including at least two cathode materials capable of causing voltage relaxation at an idle state or a no-load state in the intrinsic voltage range should be interpreted as being within the scope of the present disclosure regardless of the number of cathode materials or the presence of other additives, as obvious to those skilled in the art.

The secondary battery may be loaded on various kinds of electric-driven apparatuses driven by electric energy, and the kind of the electric-driven apparatus is not specially limited.

In an embodiment, the electric-driven apparatus may be a mobile computer device such as a cellular phone, a laptop, and a tablet computer; or a hand-held multimedia device such as a digital camera, a video camera, and an audio/video regenerating device.

In another embodiment, the electric-driven apparatus may be an electric-powered apparatus such as an electric vehicle, a hybrid vehicle, an electric bike, a motor cycle, an electric train, an electric ship, and an electric airplane; or a motor-mounted power tool such as an electric drill and an electric grinder.

In another embodiment, the electric-driven apparatus may be a large power storage device installed at a power grid to store new regeneration energy or surplus energy in a power plant, or an uninterrupted power supply for supplying power to various information communication devices such as server computers and mobile communication devices in times of emergency such as a blackout.

In the present disclosure, the secondary battery may include a cathode containing the blended cathode material, an anode and a separator. The secondary battery may further include an electrolyte having operating ions. The electrolyte is not specially limited if it has operating ions and may cause an electrochemical oxidation or reduction reaction at the cathode and the anode by means of the operating ions.

The secondary battery may further include a package for sealing the cathode, the anode and the separator. The package is not specially limited if it has chemical and physical stability and mechanical durability. The appearance of the secondary battery is determined by the structure of the package. The structure of the package may be selected from various structures known in the art and may have structures such as a cylindrical shape, a rectangular shape, a pouch shape, a coin shape or curved shapes thereof, representatively.

Advantageous Effects

According to the present disclosure, capacity degradation, an open circuit voltage, a depth of discharge (DoD), a state of charge (SOC) or the like, which are used as parameters when controlling a secondary battery, can be simply and accurately estimated.

DESCRIPTION OF DRAWINGS

The accompanying drawing illustrates a preferred embodiment of the present disclosure and together with the foregoing disclosure, serves to provide further understanding of the technical spirit of the present disclosure. However, the present disclosure is not construed as being limited to the drawing.

BEST MODE

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation. Therefore, the description proposed herein is just a preferable example for the purpose of illustrations only, not intended to limit the scope of the disclosure, so it should be understood that other equivalents and modifications could be made thereto without departing from the spirit and scope of the disclosure.

The embodiments described below are based on cases where the present disclosure is applied to a lithium secondary battery. Here, the lithium secondary battery is a general name of a secondary battery where lithium ions serve as operating ions during charge and discharge to cause electrochemical reactions at a cathode and an anode. The operating ions mean ions participating in electrochemical oxidizing and reducing reactions while the secondary battery is charged or discharged, and may be for example lithium. Therefore, even though secondary batteries are called differently according to the kind of electrolyte or separator used in the lithium secondary battery, the kind of package used for packing the secondary battery, or the internal or external structure of the lithium secondary battery, such secondary batteries should be interpreted as being included in the scope of the lithium secondary battery if lithium ions are used as operating ions.

In addition, the present disclosure may also be applied to kinds of secondary batteries other than the lithium secondary batteries. Therefore, all kinds of secondary batteries should be interpreted as being included in the scope of the present disclosure if the spirit of the present disclosure may be applied even though their operating ion is not a lithium ion.

Moreover, the secondary battery is not limited to the number of its components. Therefore, the scope of the secondary battery should be interpreted as including a unit cell having an anode, an electrolyte and a cathode as a basic unit, an assembly of unit cells, a module having a plurality of assemblies connected in series in/or in parallel, a pack having a plurality of modules connected in series in/or in parallel, a battery system having a plurality of packs connected in series in/or in parallel, or the like.

Figure 1:
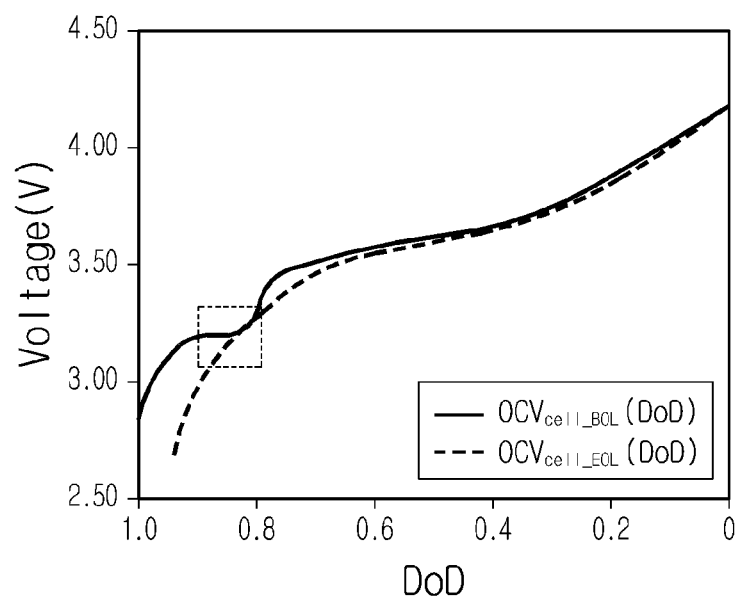
FIG. 1 is a graph showing an open circuit voltage profile of a lithium secondary battery in a state of BOL (Beginning Of Life) and a state of EOL (End Of Life), according to a depth of discharge (DoD).

FIG. 1 shows two open circuit voltage profiles of a lithium secondary battery. One is an open circuit voltage profile $OCV_{cell\_BOL}$ (DoD) measured according to a depth of discharge (DoD) after performing three charging/discharging cycles for activating the lithium secondary battery, namely in a BOL state. If the lithium secondary battery is in a BOL state, the lithium secondary battery has substantially no capacity degradation. In addition, the other is an open circuit voltage profile $OCV_{cell\_EOL}$ (DoD) measured according to a depth of discharge (DoD) after degrading the capacity of the lithium secondary battery by 7.2% by performing 621 charging/discharging cycles. For convenience, it is assumed that the lithium secondary battery which has performed 621 charging/discharging cycles is in an EOL (End Of Life) state. If the lithium secondary battery comes to the EOL state, this needs to be exchanged with a new one.

In FIG. 1, DoD marked in a horizontal axis represents a depth of discharge (DoD) of the lithium secondary battery. Based on $OCV_{cell\_BOL}$ (DoD), if DoD becomes 1, this means that the lithium secondary battery is entirely discharged, and if DoD is 0, this means that the lithium secondary battery is fully charged.

In a state where DoD is 0, if the lithium secondary battery is discharged, the depth of discharge (DoD) slowly increases. Therefore, the open circuit voltage of the lithium secondary battery decreases as the depth of discharge (DoD) increases, and if the lithium secondary battery is discharged until reaching a final discharge voltage, the depth of discharge (DoD) becomes 1. The depth of discharge (DoD) represents a relative ratio of an integrated current amount flowing out from the lithium secondary battery in comparison to an original capacity of the lithium secondary battery. In addition, the original capacity means a capacity measured when the lithium secondary battery has substantially no capacity degradation, for example in a BOL state.

The lithium secondary battery includes a cathode having a blended cathode material and an anode having graphite. In the blended cathode material, a lithium transition metal oxide $Li_{1+x}Ni_aCo_bMn_cO_2$ (x≥0; a=b=c=⅓; hereinafter, referred to as an NMC cathode material) having a layered structure and $LiFePO_4$ (referred to as an LFP cathode material) having an olivine structure are blended at a ratio of 7:3 (weight ratio). Hereinafter, a lithium secondary battery mentioned in the specification has the same specification as the lithium secondary battery described above.

Meanwhile, the cathode materials contained in the blended cathode material may be selected from various kinds of materials mentioned above, and the anode material may also be variously selected from known materials.

Referring to FIG. 1, the open circuit voltage profile $OCV_{cell\_BOL}$ (DoD) of a lithium secondary battery in a BOL state has at least one voltage plateau (see the dotted box). The voltage plateau means a region which has an inflection point and whose profile is substantially horizontal. In $OCV_{cell\_BOL}$ (DoD), the voltage plateau is located at an approximate center between 3.00V and 3.50V based on the open circuit voltage. $OCV_{cell\_EOL}$ (DoD) is shifted to the right in comparison to $OCV_{cell\_BOL}$ (DoD) and looks as if the voltage plateau disappears. FIG. 1 supports that if the charging/discharging cycle of a lithium secondary battery increases so that the lithium secondary battery is degraded, the open circuit voltage profile also varies.

The voltage plateau occurs when, at the measurement of dQ/dV distribution of two cathode materials included in the blended cathode material, the cathode materials are different from each other in locations of their main peaks and/or intensities of the main peaks exhibited in the dQ/dV distribution. Here, the dQ/dV distribution, as known in the art, represents a capacity characteristic of the cathode material at various operating voltages. The difference in locations of the main peaks may be changed depending on the kinds of the cathode materials. In another aspect, the voltage plateau occurs if the discharge resistance profile has a convex pattern, when a discharge resistance of the secondary battery containing the blended cathode material is measured at each depth of discharge (DoD). In another aspect, the voltage plateau occurs if the discharge resistance profile has at least two inflection points before and after the top of the convex pattern, when a discharge resistance of the secondary battery containing the blended cathode material is measured at each DoD. In still another aspect, when at least one cathode material included in the blended cathode material is used as a cathode material of a half cell (whose anode is a lithium electrode), the voltage plateau occurs if the voltage profile of the half cell has a voltage plateau.

Figure 2:
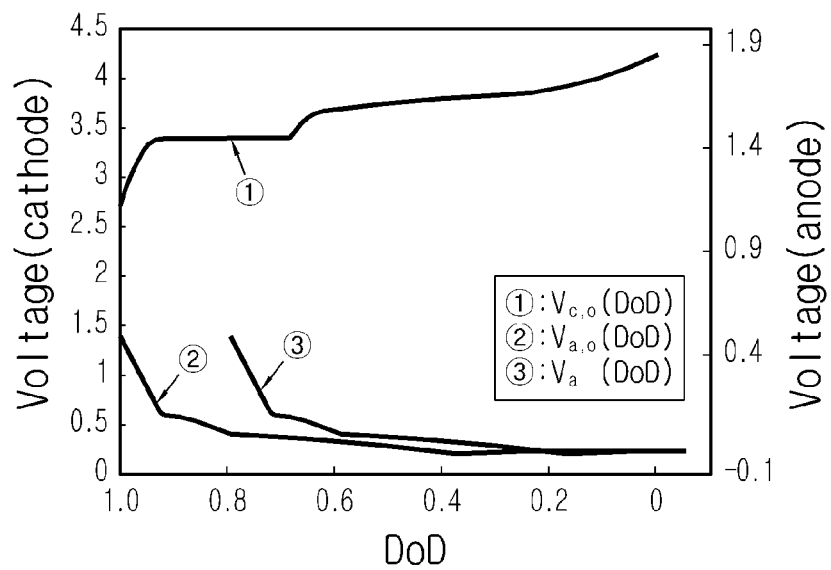
FIG. 2 is a diagram showing that an original anode voltage profile is shifted when a lithium secondary battery is degraded.

FIG. 2 is a diagram for explaining the electrochemical meaning of capacity degradation of a secondary battery.

In FIG. 2, three open circuit voltage profiles are depicted. The open circuit voltage profile marked with Number ① shows an open circuit voltage profile for a cathode of a lithium secondary battery in a BOL state with a function of a depth of discharge (DoD). Hereinafter, the open circuit voltage profile for a cathode will be called an original cathode voltage profile $V_{c,o}$ (DoD). In addition, the open circuit voltage profile marked with Number ② shows an open circuit voltage profile for an anode of a lithium secondary battery in a BOL state with a function of a depth of discharge (DoD). Hereinafter, the open circuit voltage profile for an anode will be called an original anode voltage profile $V_{a,o}$ (DoD). In addition, the open circuit voltage profile marked with Number ③ shows an open circuit voltage profile for an anode of a lithium secondary battery with capacity degradation by 20% with a function of a depth of discharge (DoD). Hereinafter, the open circuit voltage profile for an anode of a secondary battery having capacity degradation is called an anode voltage profile $V_a$ (DoD). For reference, the open circuit voltage profiles of a cathode and an anode may be obtained by measuring voltages between the cathode and a lithium metal having a reference potential (0V) and between the anode and the lithium metal after charging the lithium secondary battery to 4.2V, then periodically bringing the battery into a no-load state while discharging with a constant current, and then leaving the battery alone for a predetermined time.

Referring to FIG. 2, it may be found that the anode voltage profile $V_a$ (DoD) is a profile obtained by shifting the original anode voltage profile $V_{a,o}$ (DoD) to the right as much as 0.20.

In other words, though just 80% of capacity is discharged based on the capacity of the lithium secondary battery in a BOL state, the open circuit voltage of an anode increases to about 1.5V which corresponds to the final discharge voltage. In addition, when compared with $V_{a,o}$ (DoD), it may be found that $V_a$ (DoD) has substantially the same shape as the profile of $V_{a,o}$ (DoD) through the profile is shifted. Therefore, $V_a$ (DoD) may be regarded as being approximately identical to $V_{a,o}$ (DoD−0.2). As known in the art, capacity reduction accompanied when the lithium secondary battery is discharged is caused by electrochemical reaction of lithium. Therefore, from the fact that though just 80% of capacity is discharged based on a capacity of a lithium secondary battery in a BOL, the open circuit voltage of an anode comes to the final discharge voltage, it is construed that the capacity degradation of the lithium secondary battery may be caused because an amount of available lithium capable of participating in electrochemical oxidation and reduction while the lithium secondary battery is being discharged irreversibly decreases according to degradation of the lithium secondary battery.

The above experimental results realize the assumption that if a lithium secondary battery is degraded, the open circuit voltage profile of an anode is shifted according to capacity degradation of the lithium secondary battery.

Figure 3:
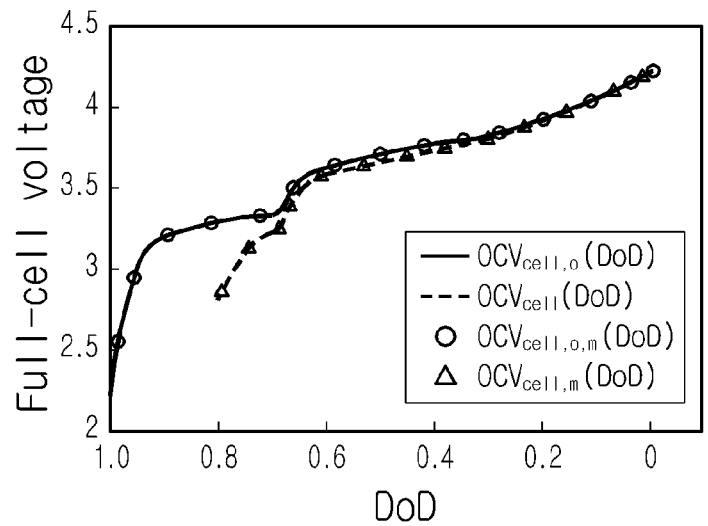
FIG. 3 is a diagram for illustrating that an open circuit voltage profile of a lithium secondary battery estimated according to the assumption of the present disclosure is in good accordance with an actual open circuit voltage profile of a lithium secondary battery.

FIG. 3 shows that the assumption is in good agreement with an actual variation of an open circuit voltage of a lithium secondary battery.

FIG. 3 shows two estimated open circuit voltage profiles and two measured open circuit voltage profiles. Each open circuit voltage profile is displayed according to a change of the depth of discharge (DoD). First, the open circuit voltage profile depicted with a solid line is an estimated open circuit voltage profile $OCV_{cell,o}$ (DoD) of a lithium secondary battery in a BOL state, which corresponds to a difference between $V_{c,o}$ (DoD) and $V_{a,o}$ (DoD) depicted in FIG. 2. Next, the open circuit voltage profile depicted with a dotted line is an open circuit voltage profile $OCV_{cell}$ (DoD) of a lithium secondary battery having capacity degradation of 20%, which corresponds to a difference between $V_{c,o}$ (DoD) and $V_a$ (DoD) depicted in FIG. 2. In addition, the open circuit voltage profile depicted with ○ corresponds to a measured open circuit voltage profile $OCV_{cell,o,m}$ (DoD) of a lithium secondary battery in a BOL state. Finally, the open circuit voltage profile depicted with ∆ corresponds to a measured open circuit voltage profile $OCV_{cell,m}$ (DoD) of a lithium secondary battery having capacity degradation of 20%. Referring to FIG. 3, both in the BOL state and in the state of 20% capacity degradation, it may be found that the estimated open circuit voltage profile is well matched with the measured open circuit voltage profile. The results depicted in FIG. 3 experimentally support the assumption that if a capacity of a lithium secondary battery is degraded, the open circuit voltage profile of an anode is shifted according to the degree of capacity degradation.

Figure 4:
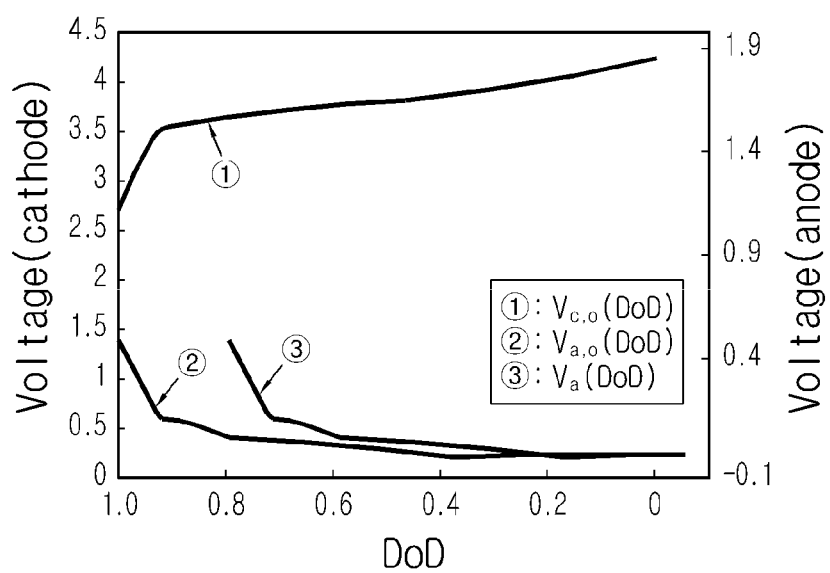
FIGS. 4 and 5 are diagrams showing that the assumption of the present disclosure may be effectively applied to a lithium secondary battery using a single cathode material.
Figure 5:
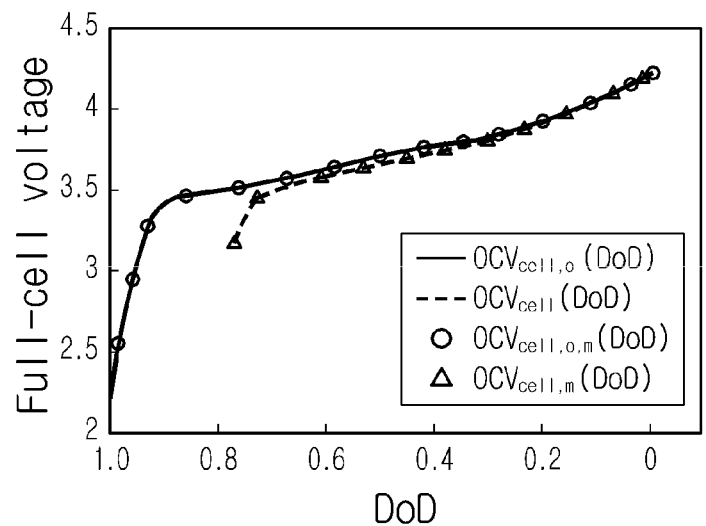

FIGS. 4 and 5 show that the assumption of the present disclosure may also be effectively applied to a lithium secondary battery using a single cathode material.

FIG. 4 shows $V_{c,o}$ (DoD), $V_{a,o}$ (DoD), and $V_a$ (DoD) of a lithium secondary battery which uses a single cathode material, namely an NMC cathode material, for a cathode.

Here, $V_{c,o}$ (DoD) and $V_{a,o}$ (DoD) respectively represent open circuit voltage profiles of a cathode and an anode, measured for each depth of discharge (DoD) when the lithium secondary battery is in a BOL state, namely the lithium secondary battery has substantially no capacity degradation. In addition, $V_a$ (DoD) represents an open circuit voltage profile of an anode, measured for each depth of discharge (DoD) when the capacity of the lithium secondary battery has been degraded by 20%.

FIG. 5 shows $OCV_{cell,o}$ (DoD) and $OCV_{cell}$ (DoD) corresponding to open circuit voltage profiles estimated by using the open circuit voltage profiles depicted in FIG. 4 and $OCV_{cell,o,m}$ (DoD) and $OCV_{cell,m}$ (DoD) corresponding to actually measured open circuit voltage profiles.

The results depicted in FIGS. 4 and 5 experimentally support that the assumption, where if the capacity of a lithium secondary battery is degraded, the open circuit voltage profile of an anode is shifted according to the degree of capacity degradation, can be applied to a lithium secondary battery including a single cathode material.

Hereinafter, an apparatus and method for estimating various parameters used for controlling operations of a secondary battery will be described based on the above disclosure.

Figure 6:
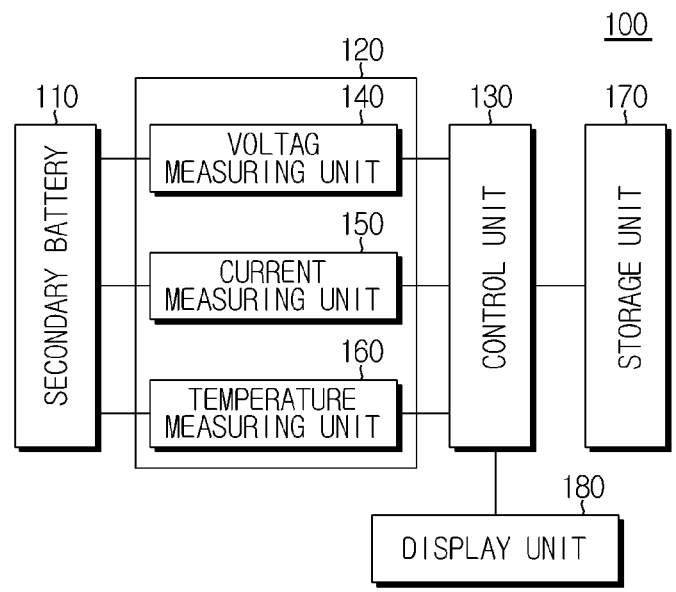
FIG. 6 is a block diagram showing an apparatus according to an embodiment of the present disclosure.

FIG. 6 is a block diagram showing an apparatus for estimating a parameter of a secondary battery 100 according to an embodiment of the present disclosure.

Referring to FIG. 6, the apparatus 100 according to the embodiment of the present disclosure is electrically coupled to a secondary battery 110. The secondary battery 110 is a battery capable of repeating charging and discharging, and the present disclosure is not limited to a specific kind of battery. Preferably, the secondary battery 110 may be a lithium secondary battery.

The apparatus 100 includes a sensor 120 and a control unit 130. The sensor 120 may include at least one selected from the group consisting of a voltage measuring unit 140, a current measuring unit 150 and a temperature measuring unit 160.

The voltage measuring unit 140 and/or the current measuring unit 150 and/or the temperature measuring unit 160 measures voltage and/or current and/or temperature of the secondary battery 110 under the control of the control unit 130 and provide a measured value to the control unit 130.

The apparatus 100 may further include a storage unit 170 as an optional component. The storage unit 170 stores and updates programs used when the control unit 130 estimates a parameter, data required when the programs are executed, or data generated when the programs are executed.

Preferably, the storage unit 170 may store a plurality of original cathode voltages ($V_{c,o}$) for each depth of discharge (DoD) and a plurality of original anode voltages ($V_{a,o}$) for each depth of discharge (DoD) measured when the secondary battery 110 has substantially no capacity degradation in advance as profile data. In addition, the storage unit 170 may store data about an original capacity measured when the secondary battery 110 has substantially no capacity degradation in advance. The original capacity may be calculated by integrating a discharge current while continuously discharging a secondary battery having substantially no capacity degradation, which has been fully charged, to a final discharge voltage.

The secondary battery has substantially no capacity degradation just after the secondary battery is fabricated, for example when a charging/discharging cycle of the secondary battery is not yet initiated (Beginning Of Life: BOL) or when the charging/discharging cycle is very small, e.g. less than 10.

The original cathode voltage ($V_{c,o}$) and the original anode voltage ($V_{a,o}$) may be measured based on a reference voltage at which potential may be 0 (for example, a lithium electrode).

Hereinafter, the plurality of original cathode voltages ($V_{c,o}$) and the plurality of original anode voltages ($V_{a,o}$) measured for each depth of discharge (DoD) are respectively called an original cathode voltage profile $V_{c,o}$ (DoD) and an original anode voltage profile $V_{a,o}$ (DoD).

The storage unit 170 is not specially limited as long as it may store data, for example DRAM, SRAM, ROM, EEPROM, Flash Memory, Register or the like.

The sensor 120 measures an open circuit voltage ($OCV_m$) of a secondary battery at a first depth of discharge (DoD') by means of the voltage measuring unit 140 and provides the measured voltage to the control unit 130.

Here, the open circuit voltage ($OCV_m$) corresponds to a difference between an original cathode voltage ($V_{c,o}$) predetermined at the first depth of discharge (DoD') and a present anode voltage ($V_a$).

Preferably, the first depth of discharge (DoD') may be a depth of discharge (DoD) calculated just before the secondary battery stops its operation, when the secondary battery in a discharge or charge mode is stopped for a sufficiently time to establish an open circuit voltage measurement condition.

The open circuit voltage measurement condition may include at least one of cases where a no-load state of the secondary battery 110 is retained over a predetermined time, where a temperature of the secondary battery 110 falls within a predetermined range, where a current flowing into or out of the secondary battery 110 is small, where a state of a small current flowing into or out of the secondary battery 110 is retained over a predetermined time or the like.

Desirable ranges for the retention time of the no-load, the temperature of the secondary battery 110, the magnitude of the current and the retention time of a low current may be determined by trials and errors and be stored in the storage unit 170 accessible by the control unit 130.

In order to monitor whether the open circuit voltage measurement condition is established, the control unit 130 may count the time while the secondary battery 110 stops its operation, and/or receive a measured temperature of the secondary battery 110 by means of the temperature measuring unit 160 of the sensor 120 to monitor a temperature of the secondary battery 110, and/or receive a measured current of the secondary battery 110 by means of the current measuring unit 150 of the sensor 120 to monitor a change of current of the secondary battery 110 according to time.

The first depth of discharge (DoD') may be calculated by means of ampere counting by the control unit 130.

For this, the sensor 120 may measure a current flowing into or out of the secondary battery 110 by means of the current measuring unit 150 while the secondary battery 110 is being charged or discharged, and provide the measured current to the control unit 130.

Then, the control unit 130 calculates an integrated current amount flowing out from the battery 110 based on the fully charged state of the secondary battery 110. In addition, the control unit 130 may calculate a depth of discharge (DoD) of the secondary battery by calculating a relative ratio of the integrated current amount in comparison to an original capacity with reference to the original capacity of the secondary battery 110 stored in the storage unit 170.

For example, if the secondary battery has an original capacity of 1000 mAh and the integrated current amount flowing out from the secondary battery 110 is 800 mAh, the depth of discharge (DoD) becomes 0.8.

The control unit 130 may store the calculated depth of discharge (DoD) in the storage unit 170 and continuously update the data while the secondary battery 110 is in operation.

If the open circuit voltage ($OCV_m$) measured at the first depth of discharge (DoD') is provided from the sensor 120, the control unit 120 identifies an original cathode voltage ($V_{c,o}$) corresponding to the first depth of discharge (DoD') from a plurality of original cathode voltages ($V_{c,o}$) stored for each depth of discharge (DoD) in the storage unit 170.

In addition, the control unit 120 subtracts the measured open circuit voltage ($OCV_m$) from the identified original cathode voltage ($V_{c,o}$) to calculate a present anode voltage ($V_a$) of the anode of the secondary battery 110, and determines the calculated value as the original anode voltage ($V_{a,o}$) of the secondary battery 110.

Moreover, the control unit 120 obtains a second depth of discharge (DoD'') corresponding to the determined original anode voltage ($V_{a,o}$) from a plurality of original anode voltages ($V_{a,o}$) stored in the storage unit 170 for each depth of discharge (DoD).

In addition, the control unit 120 calculates a difference between the first depth of discharge (DoD') and the second depth of discharge (DoD'').

The difference between the first depth of discharge (DoD') and the second depth of discharge (DoD'') quantitatively shows how much the anode voltage profile $V_a$ (DoD) formed at the anode of the secondary battery 110 is shifted from the original anode voltage profile $V_{a,o}$ (DoD) of the secondary battery. In addition, the shifting amount of the original anode voltage profile $V_{a,o}$ (DoD) represents the degree of capacity degradation of the secondary battery 110.

Therefore, the control unit 120 may determine the difference between the first depth of discharge (DoD') and the second depth of discharge (DoD'') as capacity degradation ($\Delta$capa) of the secondary battery 110.

Figure 7:
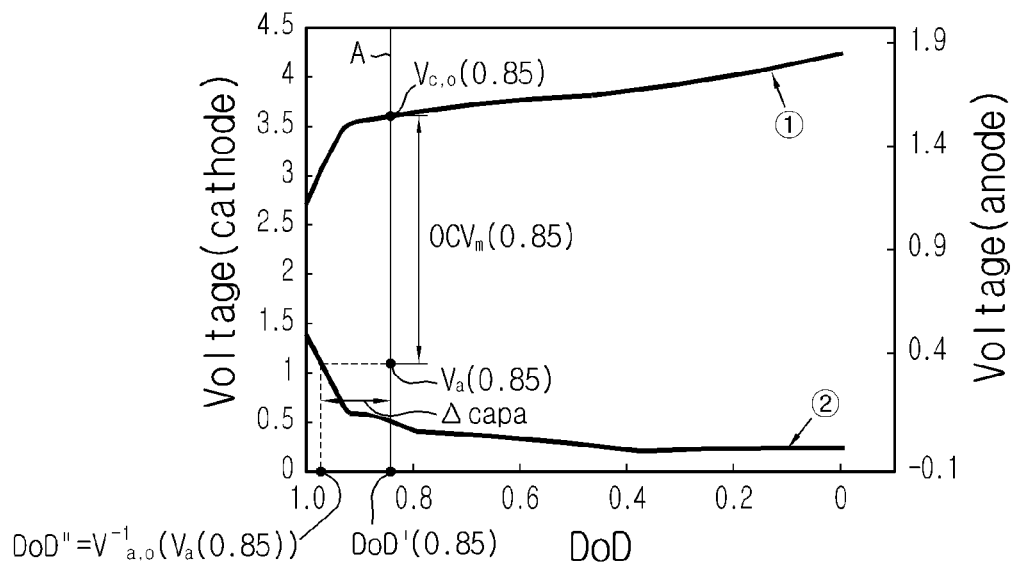
FIGS. 7 and 8 are graphs conceptually showing that a difference between a first depth of discharge (DoD') and a second depth of discharge (DoD") corresponds to capacity degradation ($\Delta$capa) of a secondary battery.

FIG. 7 is a graph conceptually showing that the difference between the first depth of discharge (DoD') and the second depth of discharge (DoD'') corresponds to capacity degradation ($\Delta$capa) of the secondary battery 110.

In FIG. 7, the profile ① shows the original cathode voltage profile $V_{c,o}$ (DoD) of the secondary battery 110 measured according to the depth of discharge (DoD), and the profile ② shows the original anode voltage profile $V_{a,o}$ (DoD) of the secondary battery 110 measured according to the depth of discharge (DoD).

The secondary battery whose $V_{c,o0}$ (DoD) and $V_{a,o}$ (DoD) are obtained includes NMC cathode material and carbon respectively in a cathode and an anode, and their voltage profiles are measured by using a lithium electrode with a potential voltage of 0V as a reference electrode. The profiles ① and ② are substantially identical to the graphs ① and ② of FIG. 4.

Referring to FIG. 7, a location A marks a point when an open circuit voltage of the secondary battery 110 is measured, and at the point when the open circuit voltage is measured, the secondary battery 110 has a depth of discharge (DoD) of 0.85. Here, the depth of discharge (DoD) of 0.85 corresponds to the first depth of discharge (DoD') of the former embodiment. The original cathode voltage ($V_{c,o}$) of the secondary battery 110 when the first depth of discharge (DoD') is 0.85 may be referred from the storage unit 170, and the open circuit voltage ($OCV_m$) when the depth of discharge (DoD) is 0.85 may be known through measurement. Since the open circuit voltage ($OCV_m$) of the secondary battery 110 corresponds to a difference between a cathode voltage and an anode voltage, the anode voltage $V_a$ (0.85) when the depth of discharge (DoD) is 0.85 may be easily calculated by the equation of $V_{c,o}$ (0.85)−$OCV_m$ (0.85). Meanwhile, the anode voltage ($V_a$) is located on a profile obtained by shifting the profile ② as much as capacity degradation of the secondary battery 110. The shifting amount of the profile ② may be easily obtained by identifying a second depth of discharge (DoD'') corresponding to an original anode voltage having the same magnitude as the anode voltage $V_a$ (0.85) on the profile ②. In other words, second depth of discharge (DoD'') is $V^{-1}_{a,o}$ ($V_a$ (0.85)) as indicated by a dotted line, and the shifting amount of the profile ② is 0.85−$V^{-1}_{a,o}$ ($V_a$ (0.85)), and this value corresponds to capacity degradation $\Delta$capa of the secondary battery 110.

Figure 8:
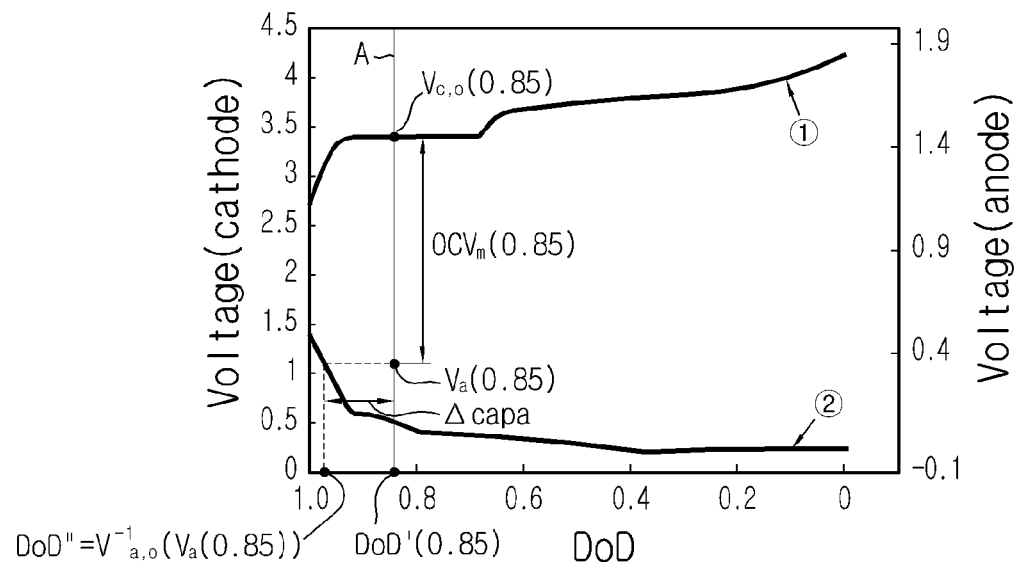

FIG. 8 is a graph conceptually showing that the difference between the first depth of discharge (DoD') and the second depth of discharge (DoD'') corresponds to capacity degradation ($\Delta$capa) of the secondary battery 110 even though the secondary battery 110 includes a blended cathode material.

In FIG. 8, the profile ① shows an original cathode voltage profile $V_{c,o}$ (DoD) of the secondary battery 110 measured according to the depth of discharge (DoD), and the profile ② shows an original anode voltage profile $V_{a,o}$ (DoD) of the secondary battery 110 measured according to the depth of discharge (DoD).

The secondary battery whose $V_{c,o}$ (DoD) and $V_{a,o}$ (DoD) are obtained includes a blended cathode material in which NMC cathode material and LFP cathode material are blended at a ratio of 7:3 (weigh ratio) in a cathode and also includes carbon in an anode, and their voltage profiles are measured by using a lithium electrode with a potential voltage of 0V as a reference electrode. The profiles ① and ② are substantially identical to the graphs ① and ② of FIG. 2.

Referring to FIG. 8, even though the secondary battery includes a blended cathode material, if the open circuit voltage $OCV_m$ (0.85) is measured when the first depth of discharge (DoD') is 0.85, the shifting amount of the profile ② is 0.85−$V^{-1}_{a,o}$ ($V_a$ (0.85)), and it may be found that this value corresponds to capacity degradation $\Delta$capa of the secondary battery 110.

In another aspect of the present disclosure, the control unit 130 may obtain a degraded open circuit voltage profile of the secondary battery 110 by shifting the original anode voltage profile $V_{a,o}$ (DoD) of the secondary battery 110 as much as the determined capacity degradation $\Delta$capa, and subtracting the shifted original anode voltage profile $V_{a,o}$ (DoD−$\Delta$capa) from the original cathode voltage profile $V_{c,o}$ (DoD). The control unit 130 may selectively store the degraded open circuit voltage profile in the storage unit 170 and update the open circuit voltage profile of the secondary battery 110 whenever $\Delta$capa is updated.

In another aspect of the present disclosure, the control unit 130 may calculate a depth of discharge (DoD) of the secondary battery 110 by using the integrated current amount calculated through ampere counting, and determine an open circuit voltage of the secondary battery 110, which corresponds to the calculated depth of discharge (DoD), with reference to the degraded open circuit voltage profile stored in the storage unit 170.

In another aspect of the present disclosure, the control unit 130 may measure an open circuit voltage $OCV_m$ of the secondary battery, and determines a depth of discharge (DoD) of the secondary battery from the measured open circuit voltage $OCV_m$ with reference to the degraded open circuit voltage profile stored in the storage unit 170. If the degraded open circuit voltage profile is expressed as $OCV_{cell,aged}$ (DoD), the depth of discharge (DoD) measured from the measured open circuit voltage $OCV_m$ is $OCV^{-1}_{cell,aged}$ ($OCV_m$).

In another aspect of the present disclosure, the control unit 130 may determine SOC of the secondary battery through Equation 2 below by using the depth of discharge (DoD) determined from the measured open circuit voltage $OCV_m$ with reference to the degraded open circuit voltage profile $OCV_{cell,aged}$ (DoD) and the determined capacity degradation ($\Delta$capa).

$$SOC = (DoD_{max} - DoD)/DoD_{max}$$

$$DoD_{max} = 1 - \Delta Capa \qquad \text{Equation 2}$$

Here, SOC represents a state of charge of the secondary battery, $DoD_{max}$ represents a depth of discharge (DoD) when the secondary battery reaches a final discharge voltage, DoD represents a present depth of discharge determined from the measured open circuit voltage $OCV_m$, and $\Delta Capa$ represents capacity degradation determined according to the present disclosure.

In addition, the control unit 130 may optionally store and update the determined SOC in the storage unit 170.

In another aspect of the present disclosure, the control unit 130 may be electrically connected to the display unit 180 and display a parameter of the secondary battery 110 determined as described above through the display unit 180 as a graphic interface.

Here, the parameter includes at least one selected from the group consisting of capacity degradation, open circuit voltage, depth of discharge (DoD) and SOC of the secondary battery 110.

The display unit 180 may not be included in the apparatus 100 but may be included in an external device. In this case, the display unit 180 and the control unit 130 are not directly connected but indirectly connected via a control means included in the external device. Therefore, the electric connection between the display unit 180 and the control unit 130 should be interpreted as including such an indirect connection.

Meanwhile, if the control unit 130 is unable to directly display a parameter of the secondary battery 110 through the display unit 180, the parameter may be transmitted to an external device including the display unit 180. In this case, the control unit 130 may be connected to the external device and allow data transmission with the external device, the external device may receive the parameter of the secondary battery 110 from the control unit 130, and the external device may display the received parameter as a graphic interface through a display unit connected thereto.

Figure 9:
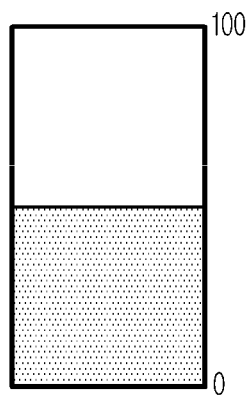
FIG. 9 is a graph showing various examples of a graphic interface used for displaying a parameter of a lithium secondary battery, which is determined according to an embodiment of the present disclosure.
Figure 9:
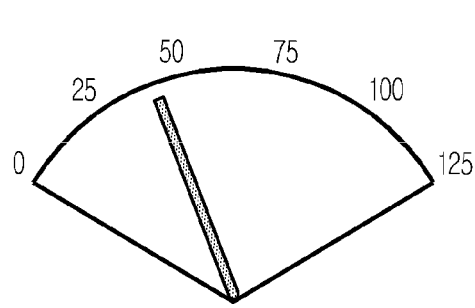

The graphic interface is not limited as long as it may display the parameter of the secondary battery to a user. FIG. 9 shows various examples of the graphic interface.

As shown in FIG. 9, the graphic interface may display the parameter of the secondary battery 110 by using a length of a bar graph (a), a gauge pointer (b), a numeral (c) or the like.

The control unit 130 may selectively include processors well known in the art, ASIC (application-specific integrated circuit), other chipsets, logic circuits, registers, communication modems, data processing devices or the like in order to execute various control logics described below. In addition, when the control logic is implemented as software, the control unit 130 may be implemented as an aggregate of program modules. At this time, program modules are stored in a memory and executed by processors. The memory unit may be present in or out of the processor and may be connected to the processor by various means. In addition, the memory may be included in a storage unit 170 (see FIG. 6) of the present disclosure. Moreover, the memory is a general name to call devices storing information, regardless of the kind of devices, without being limited to a specific memory device.

Hereinafter, based on the above configuration, a method for estimating a parameter of a secondary battery according to an embodiment of the present disclosure will be described in detail.

The method for estimating a parameter of a secondary battery is executed by the apparatus 100 described above, and any feature already explained above will not be described again here.

In addition, the steps performed by the method for estimating a parameter of a secondary battery may be executed by the control unit 130 of the apparatus 100, and thus it is obvious that each step may be included in the apparatus 100 as a function of the control unit 130.

Figure 10:
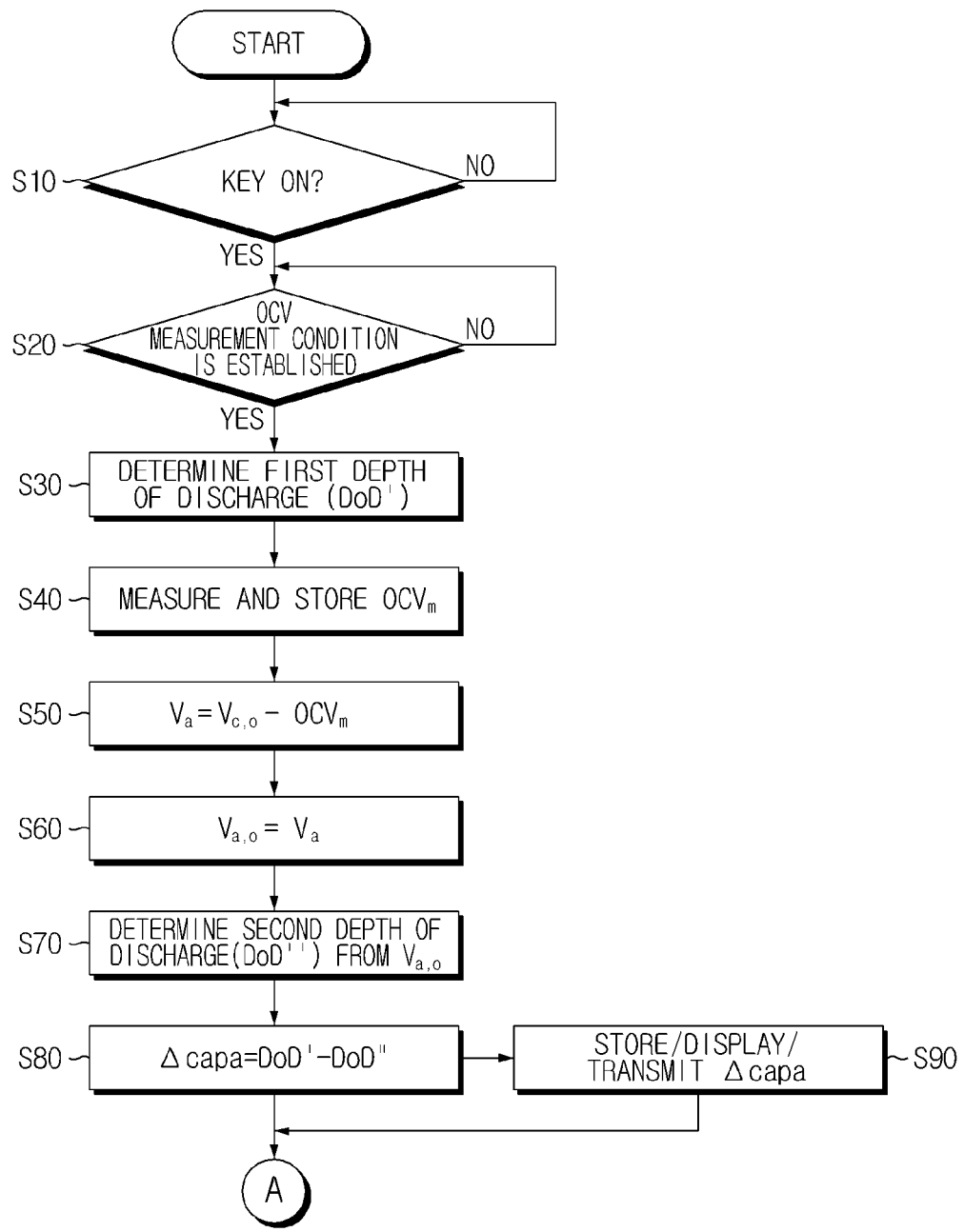
FIGS. 10 and 11 are flowcharts for illustrating a method for estimating a parameter of a secondary battery according to an embodiment of the present disclosure.
Figure 11:
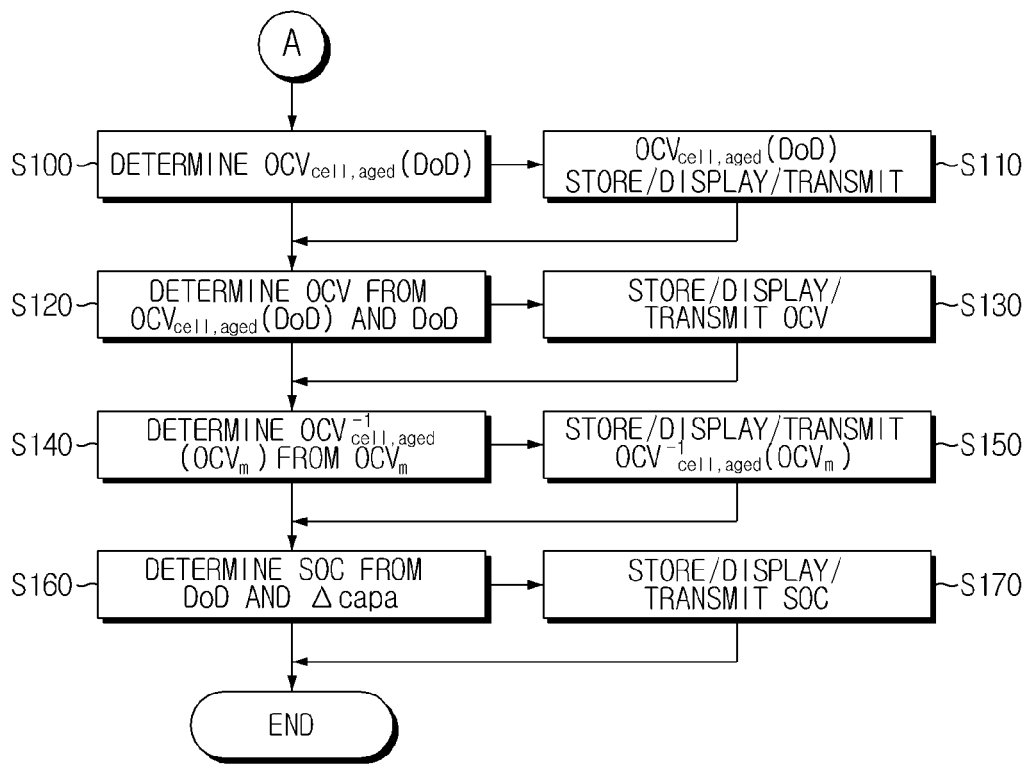

FIGS. 10 and 11 are flowcharts for illustrating the method for estimating a parameter of a secondary battery.

First, in Step S10, the control unit 130 determines whether the secondary battery 110 comes to a key-on state.

Here, the key-on state means a state just before the secondary battery 110 in a no-load state comes into a charging or discharging mode.

The key-on state may be, for example, a state where a start key turns on to operate an electric vehicle (EV), a hybrid vehicle (HEV) or a plugged hybrid vehicle (PHEV) to which the secondary battery 110 is mounted. As another example, the key-on state may be a state where a power key of a mobile device turns on.

If it is checked that the secondary battery 110 comes to a key-on state, the control unit 130 proceeds to Step S20.

In Step S20, the control unit 130 determines whether the open circuit voltage measurement condition is established.

The open circuit voltage measurement condition may be established when the secondary battery 110 stops its operation so long to stabilize the voltage of the secondary battery 110 or when a current flowing into or out of the secondary battery 110 is so small that a polarization voltage of the secondary battery 110 is negligible.

The open circuit voltage measurement condition may include at least one of conditions where a no-load state of the secondary battery 110 is retained over a predetermined time, where a temperature of the secondary battery 110 falls within a predetermined range, where a current flowing into or out of the secondary battery 110 is small, where a state of a small current flowing into or out of the secondary battery 110 is retained over a predetermined time or the like.

Desirable ranges for the retention time of the no-load, the temperature of the secondary battery 110, the magnitude of the current and the retention time of a low current may be determined by trials and errors and be stored in the storage unit 170 accessible by the control unit 130.

The control unit 130 may store a key-off time of the secondary battery 110 in the storage unit 170, and then when the secondary battery 110 comes to a key-on state, the control unit may calculate a no-load state retention time of the secondary battery 110 with reference to the stored key-off time and compares the calculated no-load state retention time with a desirable time range stored in the storage unit 170 to determine whether the open circuit voltage measurement condition is established.

The control unit 130 may receive a measured temperature of the secondary battery 110 by means of the sensor 120 at regular intervals, and compare the received measured temperature with a desirable temperature range stored in the storage unit 170 to determine whether the open circuit voltage measurement condition is established.

The control unit 130 may receive a measured current of the secondary battery 110 by means of the sensor 120 at regular intervals, and compare the received measured current with a desirable current range stored in the storage unit 170 to determine whether the open circuit voltage measurement condition is established.

When the measured current provided from the sensor 120 falls within the desirable current range stored in the storage unit 170, the control unit 130 may integrate a time during which the current flows, and compare the integrated time with a desirable time range stored in the storage unit 170 to determine whether the open circuit voltage measurement condition is established.

It is possible to combine two or more open circuit voltage measurement conditions. In this case, it may be determined that the open circuit voltage measurement condition is established when two or more conditions are satisfied.

Though not shown in the figures, the control unit 130 may receive a measured current flowing into or out of the secondary battery 110 through the sensor 120 while the secondary battery 110 is being charged or discharged, calculate a depth of discharge (DoD) by integrating the received measured current, and store and update the calculated depth of discharge (DoD) in the storage unit 170.

In Step S20, if it is determined that the open circuit voltage measurement condition is established, the control unit 130 proceeds to Step S30.

In Step S30, the control unit 130 reads a most recently calculated depth of discharge (DoD) from the storage unit 170 based on the time when the open circuit voltage measurement condition is established, and determines the depth of discharge (DoD) as a first depth of discharge (DoD').

In Step S40, when the secondary battery 110 is in the first depth of discharge (DoD) state, the control unit 130 controls the sensor 120 to measure an open circuit voltage $OCV_m$ of the secondary battery 110, and stores the measured open circuit voltage $OCV_m$ in the storage unit 170.

In Step S50, the control unit 130 determines an original cathode voltage ($V_{c,o}$) corresponding to the first depth of discharge (DoD') with reference to the original cathode voltage ($V_{c,o}$) stored in the storage unit 170 for each depth of discharge (DoD), and subtracts the measured open circuit voltage $OCV_m$ from the determined original cathode voltage ($V_{c,o}$) to determine an anode voltage $V_a$ of the secondary battery 110.

In Step S60, the control unit 130 determines the determined anode voltage $V_a$ as an original anode voltage $V_{a,o}$ of the secondary battery 110.

In Step S70, the control unit 130 identifies a depth of discharge (DoD) corresponding to the determined original anode voltage $V_{a,o}$ with reference to the original anode voltage ($V_{a,o}$) stored in the storage unit 170 for each depth of discharge (DoD), and determines the identified depth of discharge (DoD) as a second depth of discharge (DoD").

In Step S80, the control unit 130 may determine capacity degradation Δcapa of the secondary battery 110 from the difference between the first depth of discharge (DoD') and the second depth of discharge (DoD").

In Step S90, the control unit 130 may store the determined capacity degradation Δcapa in the storage unit 170, and/or display the determined capacity degradation Δcapa on the display unit 180 as a graphic interface, and/or transmit the determined capacity degradation Δcapa to an external device.

As shown in FIG. 11, the control unit 130 may further perform at least one of the following steps selectively. When two or more steps are selectively performed, these steps may not be performed in a fixed time order, and the order of steps may be varied as desired.

In Step S100, the control unit 130 may shift the original anode voltage profile $V_{a,o}$ (DoD) of the secondary battery 110 as much as the determined capacity degradation Δcapa, and subtract the shifted original anode voltage profile $V_{a,o}$ (DoD−Δcapa) from the original cathode voltage profile $V_{c,o}$ (DoD) to determine a degraded open circuit voltage profile $OCV_{cell,aged}$ (DoD) of the secondary battery 110. In addition, the control unit 130 may update the degraded open circuit voltage profile $OCV_{cell,aged}$ (DoD) of the secondary battery 110 whenever Δcapa is updated.

In Step S110, the control unit 130 may store the the degraded open circuit voltage profile $OCV_{cell,aged}$ (DoD) in the storage unit 170, and/or display the degraded open circuit voltage profile $OCV_{cell,aged}$ (DoD) on the display unit 180 as a graphic interface, and/or transmit the degraded open circuit voltage profile $OCV_{cell,aged}$ (DoD) to an external device.

In Step S120, the control unit 130 may calculate a depth of discharge (DoD) of the secondary battery 110 by using the integrated current amount calculated by means of ampere counting, and determine an open circuit voltage of the secondary battery 110 corresponding to the calculated depth of discharge (DoD) with reference to the degraded open circuit voltage profile $OCV_{cell,aged}$ (DoD) stored in the storage unit 170.

In Step S130, the control unit 130 may store the determined open circuit voltage of the secondary battery 110 in the storage unit 170, and/or displays the determined open circuit voltage on the display unit 180 as a graphic interface, and/or transmit the determined open circuit voltage to an external device.

In Step S140, the control unit 130 may measure an open circuit voltage $OCV_m$ of the secondary battery 110, and determine a depth of discharge (DoD) of the secondary battery from the measured open circuit voltage $OCV_m$ with reference to the degraded open circuit voltage profile $OCV_{cell,aged}$ (DoD) according to the depth of discharge (DoD), stored in the storage unit 170. The depth of discharge (DoD) calculated from the measured open circuit voltage $OCV_m$ is $OCV^{-1}_{cell,aged}(OCV_m)$.

In Step S150, the control unit 130 may store the determined depth of discharge (DoD) $OCV^{-1}_{cell,aged}(OCV_m)$ in the storage unit 170, and/or display the determined depth of discharge (DoD) $OCV^{-1}_{cell,aged}(OCV_m)$ on the display unit 180 as a graphic interface, and/or transmit the determined depth of discharge (DoD) $OCV^{-1}_{cell,aged}(OCV_m)$ to an external device.

In Step S160, the control unit 130 may determine SOC of the secondary battery by using the depth of discharge (DoD) determined from the measured open circuit voltage $OCV_m$ with reference to the degraded open circuit voltage profile $OCV_{cell,aged}$ (DoD) and the determined capacity degradation (Δcapa). SOC of the secondary battery may be determined using Equation 2 described above.

In Step S170, the control unit 130 may store the determined SOC in the storage unit 170, and/or display the determined SOC on the display unit 180 as a graphic interface, and/or transmit the determined SOC to an external device.

In the above embodiment, even though it has been illustrated that the open circuit voltage $OCV_m$ of the secondary battery 110 is a value measured by the sensor 120 when the open circuit voltage measurement condition is established, the open circuit voltage $OCV_m$ may also be a value estimated from measured data about voltage, current and temperature of the secondary battery 110.

In addition, the depth of discharge (DoD) and the state of charge (SOC) of the secondary battery 110 may be converted into each other by Equation 2. DoD is a parameter capable of quantifying an available capacity remaining in the secondary battery 110 in a discharge aspect of the secondary battery 110, and SOC is a parameter capable of quantifying an available capacity remaining in the secondary battery 110 in a charge aspect of the secondary battery 110. Therefore, the depth of discharge (DoD) and the state of charge (SOC) may be interpreted as equivalent parameters since they quantitatively represent an available capacity of the secondary battery 110.

Moreover, parameters determined by the control unit 130 may be used for controlling charge/discharge of the secondary battery 110, calculating a maximum discharge power, calculating a minimum charge power or the like, and/or may be provided to another control device through a communication interface.

In addition, any combinations of various control logics of the control unit 130 may be composed in computer-readable program codes and recorded in a computer-readable recording medium. The recording medium is not specially limited if it may be accessed by a processor included in a computer. For example, the recording medium includes at least one selected from the group consisting of ROM, RAM, register, CD-ROM, magnetic tape, hard disk, floppy disk and optical data storage. The computer-readable codes may be modulated into carrier signals and included in a communication carrier at a specific time and also be distributed to, stored in and executed by computers connected by a network. The program codes for implementing the combined control logics may be easily inferred by programmers in the art.

In various embodiments of the present disclosure, components named 'unit' should be understood as functionally distinguishable elements and not physically distinguishable elements. Therefore, each component may be integrated with another component, selectively, or each component may be divided into sub complements for efficient execution of control logic(s). However, even though components are integrated or divided, such integrated or divided components should be interpreted as being within the scope of the present disclosure if their functions are recognized as having substantially the same identity with the present disclosure, as obvious to those skilled in the art.

The present disclosure has been described in detail. However, it should be understood that the detailed description and specific examples, while indicating preferred embodiments of the disclosure, are given by way of illustration only, since various changes and modifications within the spirit and scope of the disclosure will become apparent to those skilled in the art from this detailed description.

What is claimed is:

1. An apparatus for estimating a parameter of a secondary battery, comprising:
    a sensor configured to measure an open circuit voltage ($OCV_m$) of the secondary battery at a first depth of discharge (DOD'), the open circuit voltage ($OCV_m$) corresponding to a difference between a predetermined original cathode voltage ($V_{c,o}$) at the first depth of discharge (DOD') and an anode voltage ($V_a$); and
    a control unit configured to calculate an anode voltage ($V_a$) from the original cathode voltage ($V_{c,o}$) and the open circuit voltage ($OCV_m$), determining that the original anode voltage ($V_{a,o}$) is identical to the anode voltage ($V_a$), determining a second depth of discharge (DOD") corresponding to the original anode voltage ($V_{a,o}$), and determining capacity degradation (Δcapa) of the secondary battery according to a difference between the first depth of discharge (DOD') and the second depth of discharge (DOD").

2. The apparatus for estimating a parameter of a secondary battery according to claim 1,
    wherein the control unit obtains a degraded open circuit voltage profile of the secondary battery from a profile of the original cathode voltage and a profile of the original anode voltage which is shifted as much as the capacity degradation.

3. The apparatus for estimating a parameter of a secondary battery according to claim 2,
    wherein the control unit measures an open circuit voltage of the secondary battery, and determines a depth of discharge (DoD) of the secondary battery from the degraded open circuit voltage profile by using the measured open circuit voltage.

4. The apparatus for estimating a parameter of a secondary battery according to claim 3,
    wherein the control unit stores, displays or transmits the determined depth of discharge (DoD).

5. The apparatus for estimating a parameter of a secondary battery according to claim 2,
    wherein the control unit measures a depth of discharge (DoD) of the secondary battery, and determines an open circuit voltage of the secondary battery from the degraded open circuit voltage profile by using the measured depth of discharge (DoD).

6. The apparatus for estimating a parameter of a secondary battery according to claim 5,
    wherein the control unit stores, displays or transmits the determined open circuit voltage.

7. The apparatus for estimating a parameter of a secondary battery according to claim 2,
    wherein the control unit measures a depth of discharge (DoD) of the secondary battery, and determines a state of charge (SOC) of the secondary battery by using the measured depth of discharge (DoD) and the determined capacity degradation.

8. The apparatus for estimating a parameter of a secondary battery according to claim 7,
    wherein the control unit stores, displays or transmits the determined SOC.

9. The apparatus for estimating a parameter of a secondary battery according to claim 1, further comprising:
    a storage unit in which profile data of the original cathode voltage ($V_{c,o}$) according to the change of the depth of discharge (DoD) and profile data of the original anode voltage ($V_{a,o}$) according to the change of the depth of discharge (DoD) are stored.

10. The apparatus for estimating a parameter of a secondary battery according to claim 1,
    wherein the control unit stores, displays or transmits the determined capacity degradation.

11. The apparatus for estimating a parameter of a secondary battery according to claim 1,
    wherein the secondary battery includes a blended cathode material which has a first cathode material and a second cathode material, and
    wherein the first and second cathode materials have different operating voltage ranges.

12. An electric-driven apparatus, comprising the apparatus for estimating a parameter of a secondary battery according to claim 1.

13. A non-transitory computer-readable recording medium on which the method for estimating a parameter of a secondary battery according to claim 1 is programmed and recorded.

14. A method for estimating a parameter of a secondary battery, comprising:
    measuring an open circuit voltage ($OCV_m$) of the secondary battery at a first depth of discharge (DOD'), the open circuit voltage ($OCV_m$) corresponding to a difference between an original cathode voltage ($V_{c,o}$) predetermined at the first depth of discharge (DOD') and an anode voltage ($V_a$);

calculating an anode voltage ($V_a$) from the original cathode voltage ($V_{c,o}$) and the open circuit voltage ($OCV_m$) and determining that the original anode voltage ($V_{a,o}$) is identical to the anode voltage ($V_a$);

obtaining a second depth of discharge (DOD") corresponding to the original anode voltage ($V_{a,o}$); and determining capacity degradation ($\Delta$capa) of the secondary battery according to a difference between the first depth of discharge (DOD') and the second depth of discharge (DOD").

15. The method for estimating a parameter of a secondary battery according to claim 14, further comprising:

obtaining a degraded open circuit voltage profile of the secondary battery from a profile of the original cathode voltage and a profile of the original anode voltage which is shifted as much as the capacity degradation.

16. The method for estimating a parameter of a secondary battery according to claim 15, further comprising:

measuring an open circuit voltage of the secondary battery, and determining a depth of discharge of the secondary battery from the degraded open circuit voltage profile by using the measured open circuit voltage.

17. The method for estimating a parameter of a secondary battery according to claim 16 further comprising:

storing, displaying or transmitting the determined depth of discharge (DoD).

18. The method for estimating a parameter of a secondary battery according to claim 15, further comprising:

measuring a depth of discharge (DoD) of the secondary battery, and determining an open circuit voltage of the secondary battery from the degraded open circuit voltage profile by using the measured depth of discharge (DoD).

19. The method for estimating a parameter of a secondary battery according to claim 18 further comprising:

storing, displaying or transmitting the determined open circuit voltage.

20. The method for estimating a parameter of a secondary battery according to claim 14, further comprising:

measuring a depth of discharge (DoD) of the secondary battery, and determining a SOC of the secondary battery by using the measured depth of discharge (DoD) and the determined capacity degradation.

21. The method for estimating a parameter of a secondary battery according to claim 20 further comprising:

storing, displaying or transmitting the determined SOC.

22. The method for estimating a parameter of a secondary battery according to claim 14, further comprising:

storing, displaying or transmitting the determined capacity degradation.

23. The method for estimating a parameter of a secondary battery according to claim 14, wherein the secondary battery includes a blended cathode material which has a first cathode material and a second cathode material, and wherein the first and second cathode materials have different operating voltage ranges.

\* \* \* \* \*